(12) United States Patent
Yao et al.

(10) Patent No.: US 10,600,685 B2
(45) Date of Patent: Mar. 24, 2020

(54) METHODS TO FILL HIGH ASPECT RATIO FEATURES ON SEMICONDUCTOR SUBSTRATES WITH MOCVD COBALT FILM

(71) Applicant: APPLIED MATERIALS, INC., Santa Clara, CA (US)

(72) Inventors: Daping Yao, San Jose, CA (US); Jiang Lu, Milpitas, CA (US); Can Xu, San Jose, CA (US); Paul F. Ma, Santa Clara, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/823,422

(22) Filed: Nov. 27, 2017

(65) Prior Publication Data

US 2018/0151424 A1     May 31, 2018

Related U.S. Application Data

(60) Provisional application No. 62/426,590, filed on Nov. 27, 2016.

(51) Int. Cl.
| | |
|---|---|
| *H01L 21/44* | (2006.01) |
| *H01L 21/768* | (2006.01) |
| *H01L 23/532* | (2006.01) |
| *H01L 21/285* | (2006.01) |

(52) U.S. Cl.
CPC .. *H01L 21/76876* (2013.01); *H01L 21/28556* (2013.01); *H01L 21/76843* (2013.01); *H01L 21/76846* (2013.01); *H01L 21/76856* (2013.01); *H01L 21/76877* (2013.01); *H01L 21/76883* (2013.01); *H01L 23/53209* (2013.01)

(58) Field of Classification Search
CPC ......... H01L 21/76876; H01L 21/76856; H01L 21/76846; H01L 21/76883; H01L 21/76843; H01L 23/53209; H01L 21/28556; H01L 21/76877
USPC ....................................................... 438/681
See application file for complete search history.

(56) References Cited

U.S. PATENT DOCUMENTS

| | | | |
|---|---|---|---|
| 7,691,442 B2* | 4/2010 | Gandikota | .......... C23C 16/0281 427/248.1 |
| 8,765,601 B2* | 7/2014 | Lei | .................... H01L 21/76885 257/E21.159 |
| 2009/0053426 A1* | 2/2009 | Lu | .......................... C23C 16/16 427/540 |

(Continued)

*Primary Examiner* — Vu A Vu
(74) *Attorney, Agent, or Firm* — Moser Taboada; Alan Taboada

(57) ABSTRACT

In some embodiments, a method of forming a cobalt layer on a substrate disposed in a process chamber, includes: (a) exposing the substrate to a first process gas comprising a cobalt precursor and a hydrogen containing gas to grow a smooth cobalt layer on a first surface of the substrate and on sidewalls and a bottom surface of a feature formed in the first surface of the substrate; (b) purging the first process gas from the process chamber; and (c) annealing the substrate in a hydrogen atmosphere to fill in voids within the cobalt layer to form a void-free cobalt layer. In some embodiments, plasma treating the substrate in gas under low pressure and/or thermally baking the substrate in gas in an atmosphere under a low pressure, may be performed prior to anneal.

20 Claims, 5 Drawing Sheets

(56) References Cited

U.S. PATENT DOCUMENTS

| | | | |
|---|---|---|---|
| 2013/0260555 A1* | 10/2013 | Zope | H01L 21/4846 |
| | | | 438/660 |
| 2015/0093891 A1* | 4/2015 | Zope | H01L 21/76877 |
| | | | 438/618 |
| 2015/0203961 A1* | 7/2015 | Ha | C23C 16/045 |
| | | | 427/124 |
| 2016/0017482 A1 | 1/2016 | Trivedi | |
| 2016/0056077 A1* | 2/2016 | Lai | H01J 37/32449 |
| | | | 438/653 |
| 2016/0240432 A1 | 8/2016 | Tao et al. | |
| 2017/0178956 A1 | 6/2017 | Park et al. | |
| 2018/0012732 A1 | 1/2018 | Yao et al. | |
| 2018/0151424 A1 | 5/2018 | Yao et al. | |

\* cited by examiner

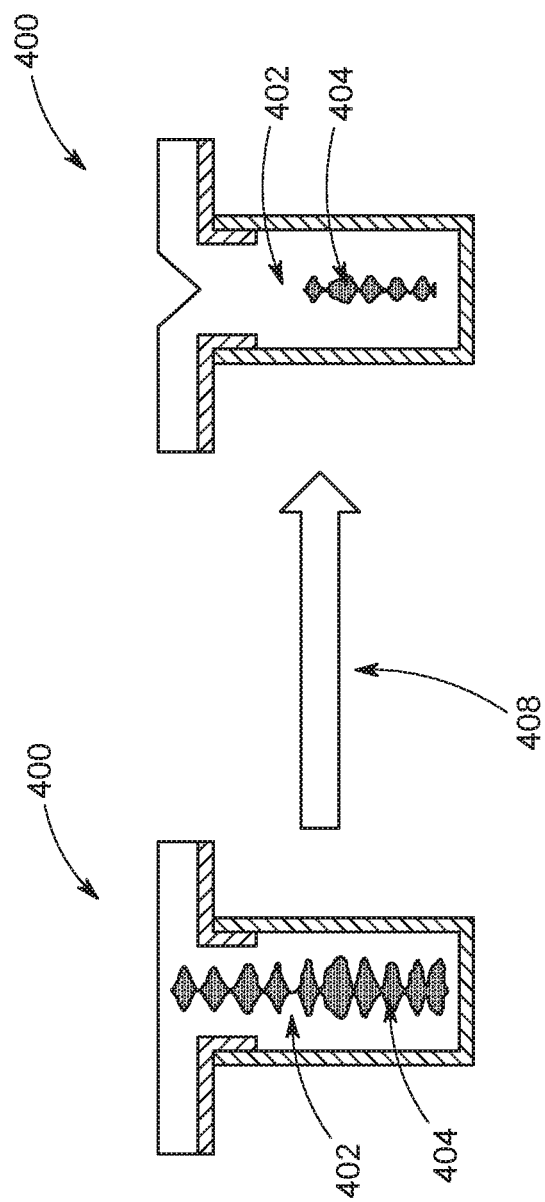

__US 10,600,685 B2__

METHODS TO FILL HIGH ASPECT RATIO FEATURES ON SEMICONDUCTOR SUBSTRATES WITH MOCVD COBALT FILM

CROSS-REFERENCE TO RELATED APPLICATIONS

This application claims the benefit of U.S. Provisional Patent Application No. 62/426,590, filed with the United States Patent Office on Nov. 27, 2016, which is herein incorporated by reference in its entirety.

FIELD

Embodiments of the present disclosure generally relate to methods of depositing cobalt in features formed on a substrate.

BACKGROUND

Standard metal organic chemical vapor deposition (MOCVD) processing consists of post deposition in-situ treatments of thermally deposited metal films having a predetermined thickness via plasma or hydrogen ($H_2$) thermal bake to purify the thermally deposited metal films of predetermined thickness. Total film thickness of the thermally deposited metal films is achieved by varying the number of deposition and post-deposition treatment cycles, as determined by the dimensions of the structural features on semiconductor substrates. Standard MOCVD processing leads to deposition of rough cobalt (Co) film filled inside the features. The rough cobalt (Co) film pinches off early in the deposition process resulting in significant seam formation within the feature. Once the entry path into the feature is sealed no additional cobalt (Co) atoms can be transported into the seam during deposition. Therefore, a limited number of cobalt (Co) atoms can migrate into the feature during densification via high temperature hydrogen ($H_2$) anneal. The distance for cobalt (Co) atoms to transport down to the lower portion of the feature becomes too large. As a result, voids are formed within the feature. While increasing the treatment frequency can reduce the number of voids, increasing the treatment frequency also reduces productivity significantly. Increasing the precursor flow enhances filling atoms inside the feature, but still cannot achieve a void free fill without sacrificing productivity.

Accordingly, the inventors have developed improved techniques to deposit void free cobalt in features disposed in a substrate.

SUMMARY

Embodiments of the present disclosure include methods for forming a cobalt layer on a substrate disposed in a process chamber. In some embodiments, a method of forming a cobalt layer on a substrate disposed in a process chamber, includes: (a) exposing the substrate to a first process gas including a cobalt precursor and a hydrogen containing gas to grow a smooth cobalt layer on a first surface of the substrate and on sidewalls and a bottom surface of a feature formed in the first surface of the substrate; (b) purging the first process gas from the process chamber; and (c) annealing the substrate in a hydrogen atmosphere to fill in voids within the cobalt layer to form a void-free cobalt layer.

In some embodiments, a method for forming a cobalt layer on a substrate disposed in a process chamber, includes: (a) exposing the substrate to a ruthenium precursor to form a ruthenium layer on a first surface of the substrate and on sidewalls and a bottom surface of a feature formed in the first surface of the substrate, wherein the feature has an aspect ratio of about 6:1 to about 20:1; (b) purging the process chamber of the ruthenium precursor; (c) exposing the substrate to a first process gas including a cobalt precursor and an ammonia ($NH_3$) gas to grow a smooth cobalt layer on the ruthenium layer formed on the first surface of the substrate and on the sidewalls and the bottom surface of the feature formed in the first surface of the substrate; (d) purging the first process gas from the process chamber; (e) exposing the substrate to a plasma generated from a second process gas including hydrogen, nitrogen, argon, helium, or mixtures thereof and/or thermally baking the substrate in hydrogen containing gas in an atmosphere under a pressure of less than one ATM; (f) repeating (c)-(e) to fill the feature with a cobalt layer; and (g) annealing the substrate in a hydrogen atmosphere to fill in voids within the cobalt layer to form a void-free cobalt layer.

In some embodiments, a computer readable medium, having instructions stored thereon which, when executed, cause a process chamber to perform a method of forming a cobalt layer on a substrate disposed in a process chamber are provided herein. For example, in some embodiments, a computer readable medium, having instructions stored thereon which, when executed, cause a process chamber to perform a method of forming a cobalt layer on a substrate disposed in a process chamber, the method including: (a) exposing the substrate to a first process gas comprising a cobalt precursor and a hydrogen containing gas to grow a smooth cobalt layer on a first surface of the substrate and on sidewalls and a bottom surface of a feature formed in the first surface of the substrate; (b) purging the first process gas from the process chamber; and (c) annealing the substrate in a hydrogen atmosphere to fill in voids within the cobalt layer to form a void-free cobalt layer, or optionally, thermal baking the substrate in hydrogen containing gas in an atmosphere under less than one ATM pressure to remove impurities within the cobalt layer to enhance void-free cobalt fill when subsequent anneal process is performed. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 4A-4B depicts the results of depositing a cobalt layer via a standard MOCVD process.

Figure 1:
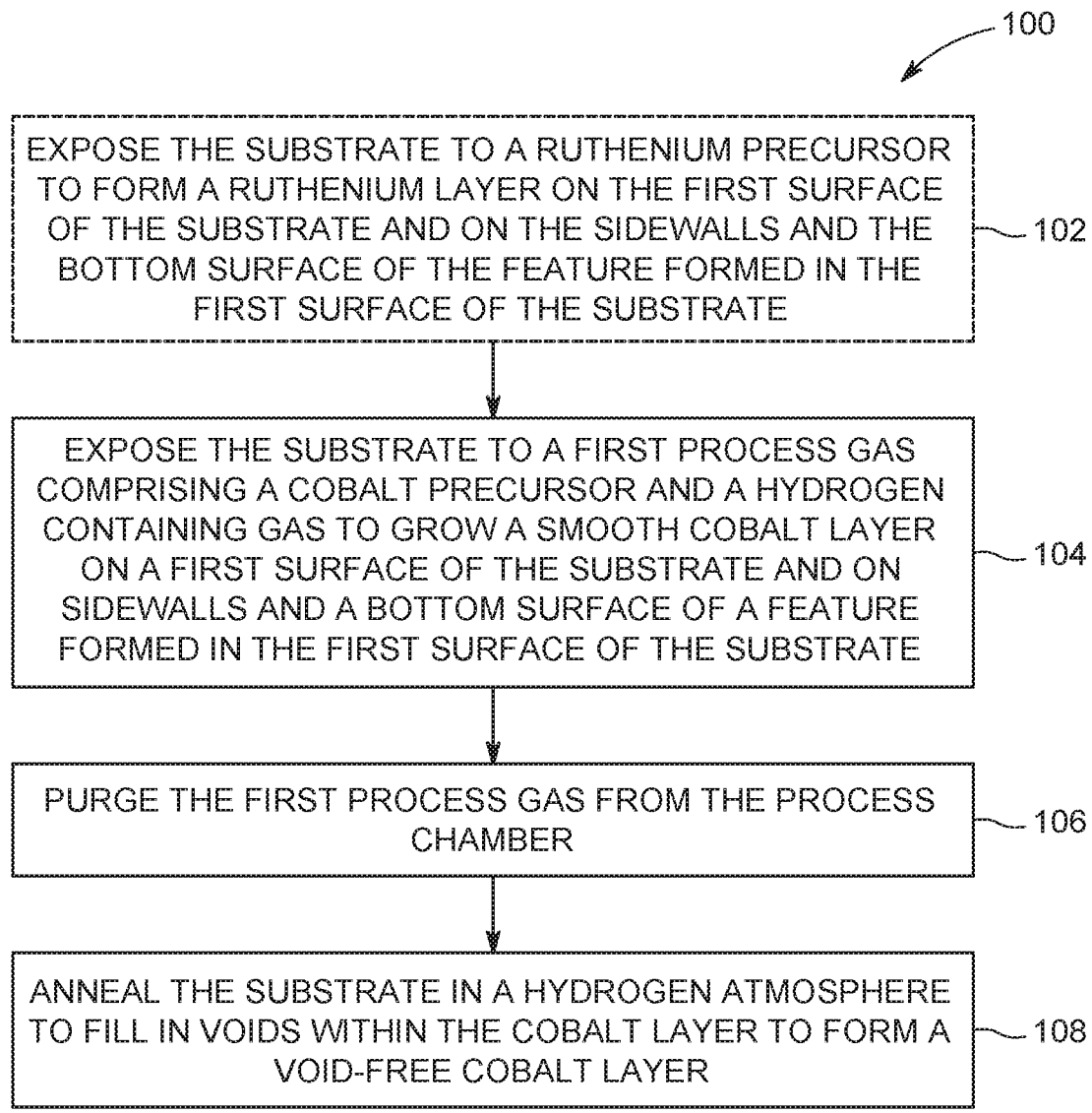
FIG. 1 depicts a flowchart of a method of forming a cobalt layer on a substrate disposed in a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to improved methods of depositing void free cobalt in features disposed in a substrate. A standard metal organic chemical vapor deposition (MOCVD) process consists of thermal deposition of, for example, a cobalt layer via exposing a semiconductor wafer to suitable cobalt precursors, a post-deposition purge of the cobalt precursors, and post deposition treatment processes. The post deposition treatment processes includes a plasma process and a thermal process. The plasma process exposes the semiconductor wafer to a plasma generated from hydrogen, nitrogen, argon, helium, or mixtures thereof to remove contaminants from the cobalt layer. The thermal process exposes the semiconductor wafer to a pre-determined pressure (5-300 Torr) in hydrogen containing gas mixture, while heating the semiconductor wafer. FIG. 4A shows a feature 400 filled with a cobalt material 402 using a standard MOCVD process resulting in seams (i.e. voids 404) formed within the feature 400. Following the hydrogen anneal 408, some cobalt material migrates into the seams. However, as shown in FIG. 4B, due to the feature size (i.e. aspect ratio of about 6:1 to about 20:1) the cobalt material cannot reach voids 404 near the lower portion of the feature 400. Generally, a standard MOCVD process in high aspect ratio features of the kind described herein, will result in voids in the bottom one half to one third of the feature 400. While increasing treatment frequency can reduce the number of voids, increasing the treatment frequency also reduces productivity significantly. In at least some embodiments, the inventive methods described herein advantageously deposit void free cobalt layers with improved semiconductor substrate throughput. The inventive methods may be utilized with any device nodes, but may be particularly advantageous in device nodes having a height to width aspect ratio of about 6:1 to about 20:1.

FIG. 1 depicts a flow chart of a method 100 for forming a cobalt layer in accordance with some embodiments of the present disclosure. The method 100 is described below with respect to an interconnect structure, as depicted in FIGS. 2A-2E and may be performed, for example, in a suitable reactor, such as is described below with respect to FIG. 3. The method 100 may be performed in suitable process chambers configured for one or more of chemical vapor deposition (CVD) or atomic layer deposition (ALD).

Figure 2A:
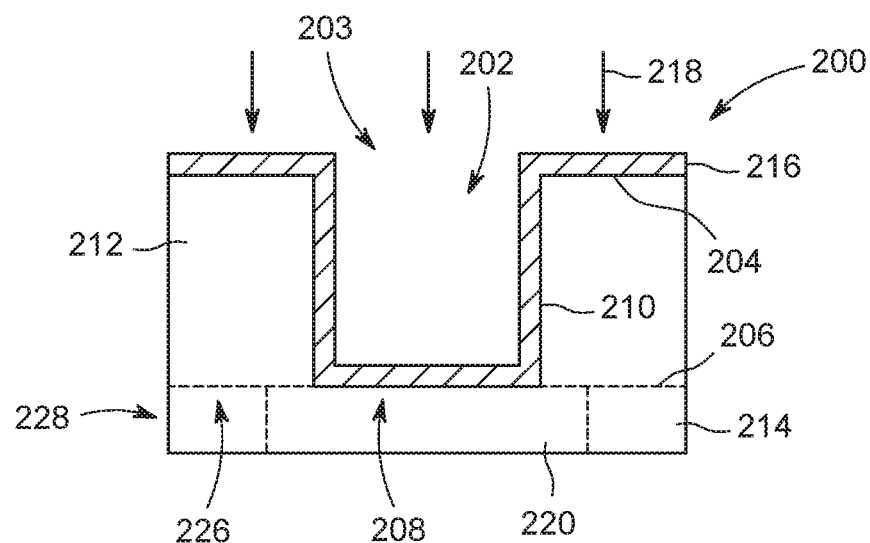
FIGS. 2A-2E depict the stages of processing a substrate in accordance with some embodiments of the present disclosure.

FIG. 2A depicts a substrate 200 having a feature 202 including an opening 203 formed in a first surface 204 of the substrate 200 and extending into the substrate 200 towards an opposing second surface 206 of the substrate 200. The substrate 200 may be any suitable substrate having a feature 202 formed in the substrate. For example, the substrate 200 may include one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The feature 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., conductive material 220) may be disposed in the second dielectric layer 214 and may be aligned with the feature 202 such that the feature, when filled with a conductive material, provides an electrical path to and from the conductive material. For example, the conductive material may be part of a line or via to which the interconnect is coupled.

The feature 202 may be any feature, such as a via, trench, dual damascene structure, or the like. In some embodiments, the feature 202 may have a height to width aspect ratio of about 6:1 to about 20:1. The feature 202 may be formed by etching the substrate 200 using any suitable etch process. The feature 202 is defined by an opening 203, a bottom surface 208, and sidewalls 210.

In some embodiments, the substrate 200 may be covered with one or more layers prior to depositing the cobalt layer as described below. For example, the sidewalls 210, the bottom surface 208, and the first surface 204 of the substrate 200 may be covered by an adhesion layer 216. The adhesion layer 216 may serve to enhance sticking of subsequently deposited metal layer into underlying layers, such as first dielectric layer 212. The adhesion layer 216 may include any material suitable to act as a barrier. For example, in some embodiments, the adhesion layer 216 may comprise a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The adhesion layer 216 may have any thickness suitable to enhance sticking of subsequently deposited metal layer materials into underlying layers. For example, in some embodiments, the adhesion layer 216 layer may have a thickness of about 10 to about 50 angstroms. The adhesion layer 216 may be formed by any process suitable to provide the adhesion layer 216 having a suitable thickness. For example, in some embodiments, the adhesion layer 216 may be formed via a deposition process, such as chemical vapor deposition, physical vapor deposition, or a cyclical deposition process, for example, such as atomic layer deposition, or the like. The adhesion layer 216 may be shaped to conform with the shape of the substrate upon which it is disposed. In embodiments, the adhesion layer 216 does not fill the feature entirely and has a thickness which allows other layers to be deposited thereon within the feature.

In some embodiments, and as illustrated by dotted lines in FIG. 2A, the feature 202 may extend completely through the substrate 200 and an upper surface 226 of a second substrate 228 and may form the bottom surface 208 of the feature 202. The second substrate 228 may be disposed adjacent to the second surface 206 of the substrate 200. Further (and also illustrated by dotted lines), a conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the feature 202. In some embodiments, the conductive material (e.g., 220) aligned with the feature 202 may include copper.

Figure 2B:
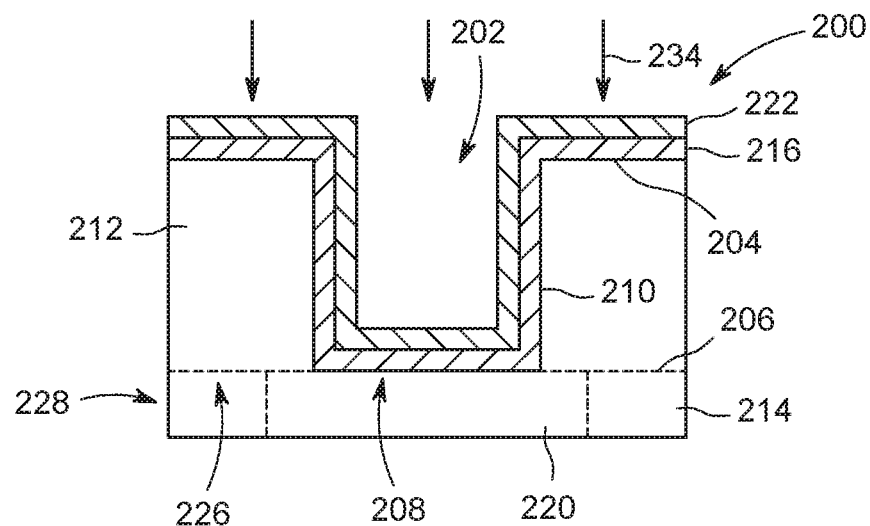

In some embodiments, the method begins at 102 and as depicted in FIG. 2A-2B, by exposing the substrate 200 to a ruthenium precursor 218 to deposit a ruthenium layer 222 on the substrate 200 (i.e. on the adhesion layer 216 or barrier layer if present). The ruthenium layer 222 is formed on the first surface 204, the sidewalls 210 and the bottom surface 208 (i.e. on the adhesion layer 216 or barrier layer disposed upon the first surface 204, the sidewalls 210 and the bottom surface 208). In some embodiments, the ruthenium precursor 218 is provided at a flow rate of about 20 mgm to about 200 mgm from liquid metal-organic Ru precursor. The ruthenium layer 222 has a thickness of 1 to about 5 nm. In some embodiments, suitable ruthenium precursors may include one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$. Following formation of the ruthenium layer 222, the process chamber is purged of the ruthenium precursor 218. The ruthenium layer 222 allows growth of a smooth cobalt layer. However, as the thickness of the subsequently deposited cobalt layer described in 104 below continues to grow, the effect of the ruthenium layer 222 becomes minimized and the roughness of the cobalt layer 232 increases. Furthermore, formation of the ruthenium layer 222 also increases process time and decreases productivity. Accordingly, formation of the ruthenium layer 222 is optional.

Figure 2C:
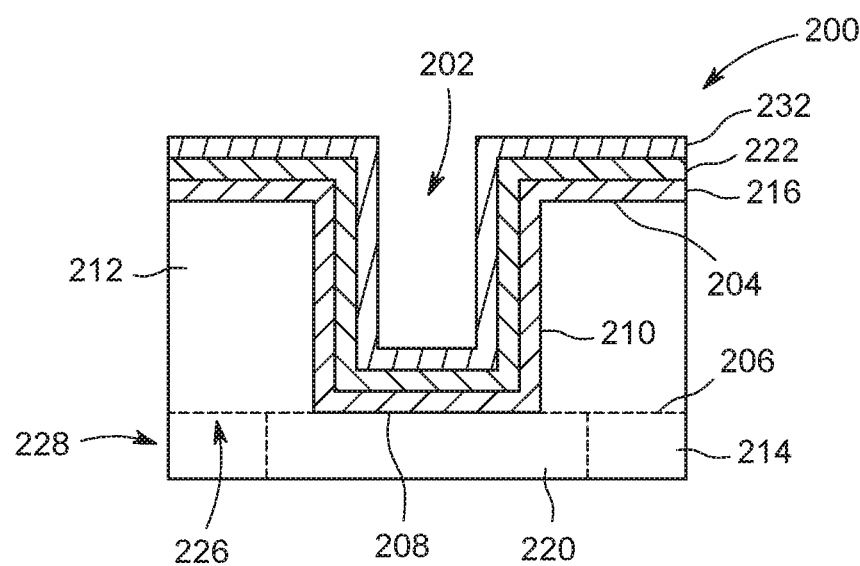

The method 100 generally begins at 104, and as depicted in FIG. 2B-2C, where the substrate 200 is exposed to a first process gas 234 including a cobalt precursor and a hydrogen containing gas to grow a smooth cobalt layer 232 on the first surface 204 of the substrate 200 and on the sidewalls 210 and the bottom surface 208 of the feature 202 (or on the ruthenium layer 222 or on the adhesion layer 216 or the barrier layer if present). In some embodiments, the first process gas 234 includes, consists of, or consists essentially of, a cobalt precursor and a hydrogen containing gas. In some embodiments, the ratio of cobalt precursor vapor flow to hydrogen containing gas flow is about 0.1% to about 1% In some embodiments, the hydrogen containing gas is a nitrogen ($NH_3$) gas, a hydrogen ($H_2$) gas, or a combination thereof. In some embodiments, the hydrogen containing gas is ammonia ($NH_3$) gas or hydrogen ($H_2$) gas. In some embodiments, the substrate 200 is exposed to the hydrogen containing gas at a flow rate of about 100 sccm to about 2,000 sccm. Without wishing to be bound by theory, the inventors have observed that by co-flowing the hydrogen containing gas with the cobalt precursor reduces film roughness of the cobalt layer 232 thereby reducing the direction growth of the cobalt layer 232 before the cobalt layer 232 pinches off the opening 203 of the feature 202. For example, a cobalt layer grown using the method 100 described herein has a roughness (RMS) value over film thickness ratio of about 5% to about 10% as compared to a cobalt layer grown by the standard MOCVD process described above which has a roughness (RMS) over film thickness ratio of about 10% to about 20%.

In some embodiments, the substrate 200 is exposed to the cobalt precursor at a flow rate of about 20 mgm to about 200 mgm. In some embodiments, suitable cobalt precursors may include one or more of cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form the cobalt layer. Dicobalt hexacarbonyl acetyl compounds may have the chemical formula of $(CO)_6CO_2(RC{\equiv}CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6CO_2(HC{\equiv}C^tBu)$) is the cobalt precursor. Other examples of dicobalt hexacarbonyl acetyl compounds include dicobalt hexacarbonyl methylbutylacetylene ($(CO)_6CO_2(MeC{\equiv}C^tBu)$), dicobalt hexacarbonyl phenylacetylene ($(CO)_6CO_2(HC{\equiv}CPh)$), hexacarbonyl methylphenylacetylene ($(CO)_6CO_2(MeC{\equiv}CPh)$), dicobalt hexacarbonyl methylacetylene ($(CO)_6CO_2(HC{\equiv}CMe)$), dicobalt hexacarbonyl dimethylacetylene ($(CO)_6CO_2(MeC{\equiv}CMe)$), derivatives thereof, complexes thereof, or combinations thereof. Other exemplary cobalt carbonyl complexes include cyclopentadienyl cobalt bis(carbonyl) ($CpCo(CO)_2$), tricarbonyl allyl cobalt ($(CO)_3Co(CH_2CH{=}CH_2)$), or derivatives thereof, complexes thereof, or combinations thereof.

Figure 2D:
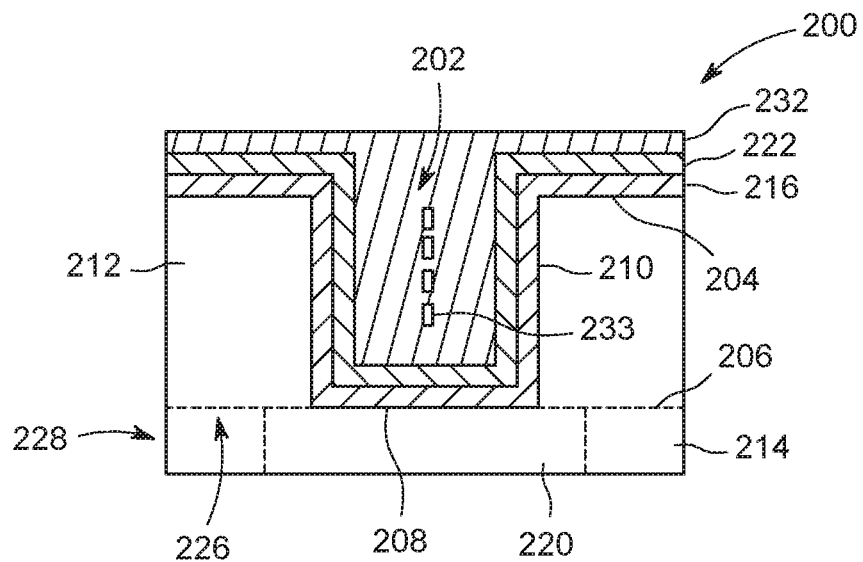

As depicted in FIG. 2D, the cobalt layer 232 grown in the feature 202 results in a more densely packed cobalt layer 232 within the feature to minimize the formation of voids. General processing conditions for forming the cobalt layer 232 discussed above include maintaining process chamber pressure at about 3 to about 60 Torr and a substrate temperature of about 120 to about 220 degrees Celsius.

Figure 2E:
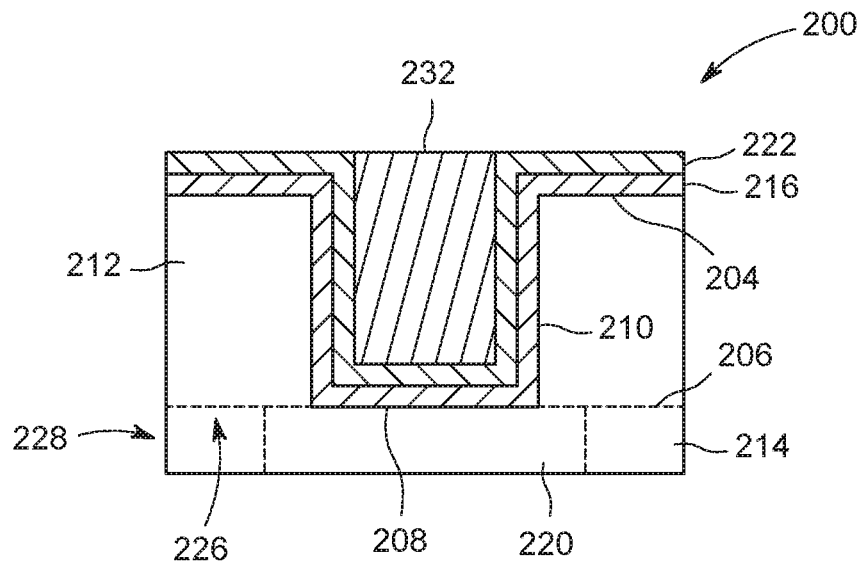

Next at 106, following growth of the cobalt layer 232 as described at 104, the first process gas is purged from the processing chamber. In some embodiments, the substrate may be thermally baked by baking in a hydrogen atmosphere. The thermal backing process exposes the substrate 200 to a hydrogen gas and to an ammonia ($NH_3$) gas while heating the semiconductor wafer. The ammonia ($NH_3$) gas helps to block or slow down directional grain growth to achieve a smooth film. The substrate 200 may be heated to a temperature within a range from about 120 to about 220 degrees Celsius or the same temperature as is in deposition. As depicted in FIG. 2E, by minimizing the formation of voids 233 during formation of the cobalt layer 232, the subsequent anneal process 108 fills in the voids 233 and produces a void free cobalt layer 232 without sacrificing productivity. In embodiments, annealing is performed in a hydrogen atmosphere. In some embodiments, annealing may be performed under any suitable annealing conditions known in the art, including known annealing temperatures and pressure.

In some embodiments, prior to the anneal process, the substrate 200 is exposed to post deposition plasma treatment process. The plasma process exposes the substrate 200 to a plasma generated from a second process gas including hydrogen, nitrogen, argon, helium, or mixtures thereof to remove contaminants from the cobalt layer. In embodiments, plasma treating the substrate may occur in hydrogen gases, such as highly concentrated hydrogen gases, under lower pressure. In embodiments, both plasma treating and thermal baking as described herein may be used together or separately. In embodiments, the plasma treating and thermal baking may be applied prior to annealing. In embodiments, the plasma treating and/or thermal baking are repeated until the feature is filled with cobalt in accordance with the present disclosure, prior to annealing. In embodiments, the plasma treating and/or thermal baking remove impurities within the cobalt layer to enhance void-free cobalt fill in subsequent anneal or annealing.

In some embodiments, the method 100 may be used to deposit a cobalt layer having a first thickness which does not fill the feature 202, and then repeated a predetermined number of times to deposit a cobalt layer to fill the feature 202. Further, when the feature 202 has been filled by the cobalt material, the feature 202 may be filled above the level of the opening 203. Accordingly, techniques, such as wet clean in an acidic solution, chemical or electrochemical mechanical polishing, or the like may be used to remove excess deposited material from the upper surface, such that the feature 202 is filled with the deposited conductive material up to about an equivalent level with the opening 203 as depicted in FIG. 2E.

In some embodiments, a method suitable for forming a cobalt layer on a substrate 310 disposed in a process chamber 302 includes: (a) exposing the substrate 310 to a first process gas including a cobalt precursor and a hydrogen containing gas to grow a smooth cobalt layer on a first surface of the substrate 310 and on sidewalls and a bottom surface of a feature formed in the first surface of the substrate 310; (b) purging the first process gas from the process chamber 302; and (c) plasma treating the substrate in highly concentrated $H_2$ gases under lower pressure; and/or (d) thermal baking the substrate in hydrogen containing gases in an atmosphere under less than one ATM pressure. In such embodiments, (c) plasma treating, and (d) thermal baking may be used together or separately, to remove impurities within the cobalt layer and/or enhance void-free cobalt fill in subsequent anneal process. In embodiments, (a) exposing, (b) purging, and (c) plasma treating may be repeated until the feature is filled with cobalt in accordance with the present disclosure. In embodiments, (a) exposing, (b) purging, and (d) thermal baking may repeated until the feature is filled with cobalt in accordance with the present disclosure. In embodiments, (a) exposing, (b) purging, (c) plasma treating and (d) thermal baking may repeated until the feature is filled with cobalt in accordance with the present disclosure. In embodiments, (a) exposing, (b) purging, and (c) plasma treating and/or (d) thermal baking may repeated in sequential order, to fill feature(s), prior to annealing as described herein.

In some embodiments, a method suitable for forming a cobalt layer on a substrate 310 disposed in a process chamber 302 includes: (a) exposing the substrate to a ruthenium precursor to form a ruthenium layer on a first surface of the substrate and on sidewalls and a bottom surface of a feature formed in the first surface of the substrate, wherein the feature has an aspect ratio of about 6:1 to about 20:1; (b) purging the process chamber of the ruthenium precursor; (c) exposing the substrate to a first process gas including a cobalt precursor and an ammonia ($NH_3$) gas to grow a smooth cobalt layer on the ruthenium layer formed on the first surface of the substrate and on the sidewalls and the bottom surface of the feature formed in the first surface of the substrate; (d) purging the first process gas from the process chamber; (e) exposing the substrate to a plasma generated from a second process gas comprising hydrogen, nitrogen, argon, helium, or mixtures thereof and/or thermally baking the substrate in hydrogen containing gas in an atmosphere under a pressure of less than one ATM; (f) filling the feature with a cobalt layer such as by repeating (c)-(e), if necessary; and (g) annealing, such as annealing the substrate in a hydrogen atmosphere to fill in voids within the cobalt layer to form a void-free cobalt layer.

In some embodiments, a method suitable for forming a cobalt layer on a substrate 310 disposed in a process chamber 302, includes: (a) exposing the substrate 310 to a first process gas comprising a cobalt precursor and a hydrogen containing gas to grow a smooth cobalt layer on a first surface of the substrate 310 and on sidewalls and a bottom surface of a feature formed in the first surface of the substrate 310; (b) purging the first process gas from the process chamber 302; and (c) annealing the substrate 310 in a hydrogen atmosphere to fill in voids within the cobalt layer to form a void-free cobalt layer, or optionally thermal baking the substrate 310 in hydrogen containing gases in an atmosphere under the pressure of less than one ATM to remove impurities within the cobalt layer to enhance void-free cobalt fill in subsequent annealing or anneal process when performed. In embodiments, thermal baking the substrate 310 in hydrogen containing gases in an atmosphere under the pressure of less than one ATM may occur prior to annealing. In embodiments, annealing comprises or consists of thermally baking the substrate in hydrogen containing gas atmosphere under the pressure of less than one ATM to remove impurities with the cobalt layer.

Figure 3:
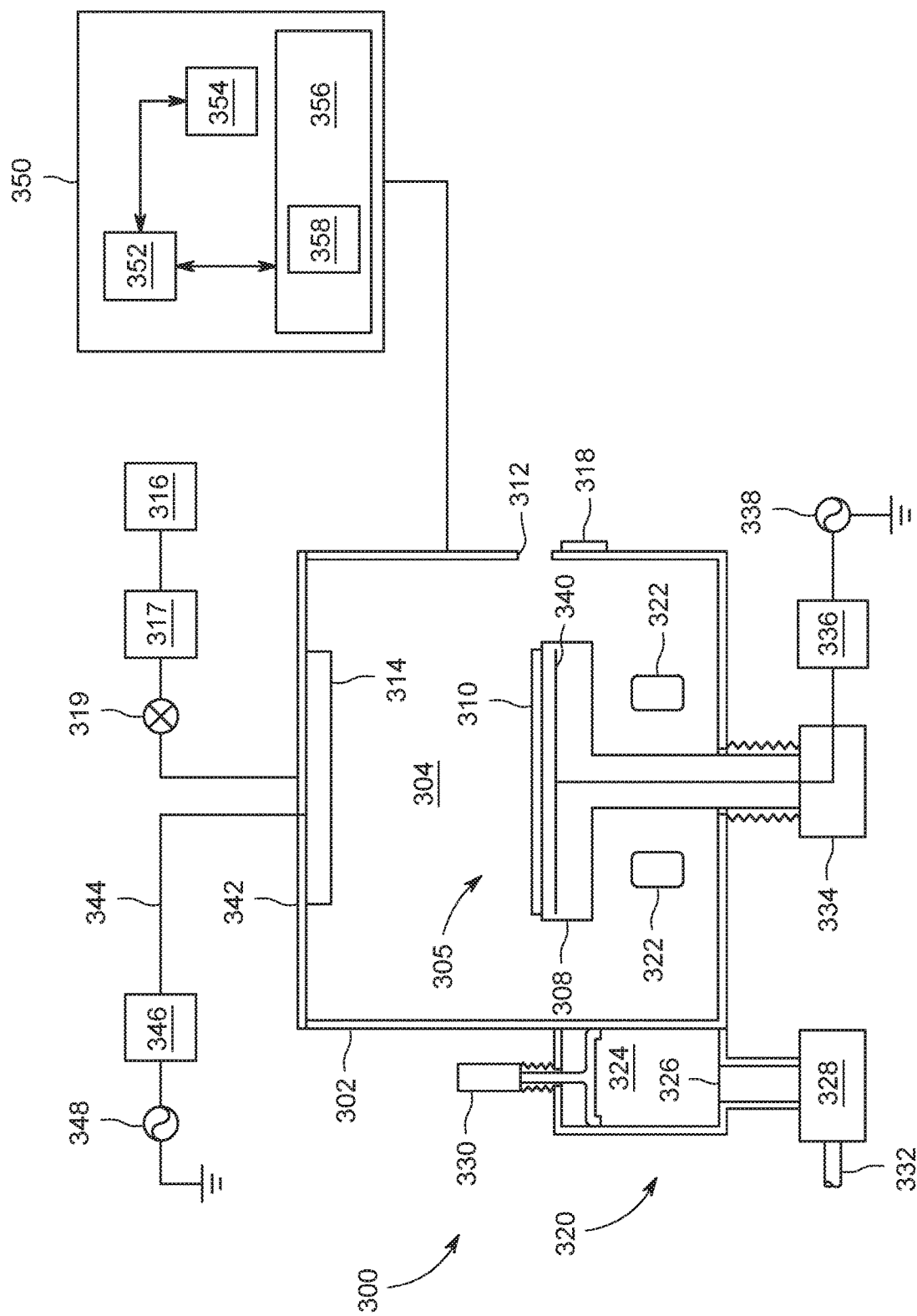
FIG. 3 depicts a process chamber suitable for performing a method of depositing cobalt in features formed on a substrate in accordance with some embodiments of the present disclosure.

FIG. 3 depicts a schematic diagram of an illustrative apparatus 300 of the kind that may be used to practice embodiments of the disclosure as discussed herein. The apparatus 300 may include a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 thereupon during processing and one or more gas inlets, such as a showerhead 314 and/or nozzles provided at predetermined locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature (such as heating and/or cooling devices, not shown) and/or for controlling the species flux and/or ion energy proximate the substrate surface.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled at 344 to one or more RF power sources (one RF power source 348 shown) through one or more respective matching networks (matching network 346 shown). The one or more plasma sources may be capable of producing up to about 1,500 W, or in some embodiments, up to about 2,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown) 302. The vacuum pump 328 may be fluidly coupled to an exhaust outlet 332 for routing the exhaust to appropriate exhaust handling equipment. A valve 330 (such as a throttle valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of forming a cobalt layer on a substrate disposed in a process chamber, comprising:
    (a) exposing the substrate to a first process gas comprising a cobalt precursor and a hydrogen containing gas to grow a smooth cobalt layer on a first surface of the substrate and on sidewalls and a bottom surface of a feature formed in the first surface of the substrate, wherein the feature has an aspect ratio of about 6:1 to about 20:1 and wherein the smooth cobalt layer has a roughness root mean square value over a layer thickness ratio of about 5% to below about 10%;
    (b) purging the first process gas from the process chamber; and
    (c) annealing the substrate in a hydrogen atmosphere to fill in voids within the cobalt layer to form a void-free cobalt layer.

2. The method of claim 1, further comprising exposing the substrate to a ruthenium precursor prior to exposing the substrate to the first process gas to form a ruthenium layer on the first surface of the substrate and on sidewalls and the bottom surface of the feature formed in the first surface of the substrate.

3. The method of claim 1, further comprising plasma treating the substrate in hydrogen gas under low pressure and/or thermally baking the substrate in hydrogen containing gas in an atmosphere under a pressure of less than one ATM.

4. The method of claim 1, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co(CH_2CH=CH_2)$), or derivatives thereof, complexes thereof, or combinations thereof.

5. The method of claim 1, wherein the hydrogen containing gas is ammonia ($NH_3$) gas or hydrogen ($H_2$) gas.

6. The method of claim 1, further comprising exposing the substrate to a plasma generated from a second process gas comprising hydrogen, nitrogen, argon, helium, or mixtures thereof.

7. The method of claim 1, further comprising repeating (a)-(c) to fill the feature with a cobalt layer.

8. The method of claim 1, wherein a ratio of cobalt precursor to hydrogen containing gas is about 0.1% to about 1%.

9. The method of claim 1, wherein the cobalt precursor is provided at a flow rate of about 20 mgm to about 200 mgm.

10. A method of forming a cobalt layer on a substrate disposed in a process chamber, comprising:
    (a) exposing the substrate to a ruthenium precursor to form a ruthenium layer on a first surface of the substrate and on sidewalls and a bottom surface of a feature formed in the first surface of the substrate, wherein the feature has an aspect ratio of about 6:1 to about 20:1;

(b) purging the process chamber of the ruthenium precursor;

(c) exposing the substrate to a first process gas comprising a cobalt precursor and an ammonia ($NH_3$) gas to grow a smooth cobalt layer on the ruthenium layer formed on the first surface of the substrate and on the sidewalls and the bottom surface of the feature formed in the first surface of the substrate;

(d) purging the first process gas from the process chamber;

(e) exposing the substrate to a plasma generated from a second process gas comprising hydrogen, nitrogen, argon, helium, or mixtures thereof and/or thermally baking the substrate in hydrogen containing gas in an atmosphere under a pressure of less than one ATM;

(f) repeating (c)-(e) to fill the feature with a cobalt layer; and (g) annealing the substrate in a hydrogen atmosphere to fill in voids within the cobalt layer to form a void-free cobalt layer.

11. The method of claim 10, wherein the ruthenium precursor is one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$.

12. The method of claim 10, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co$ ($CH_2CH=CH_2$)), or derivatives thereof, complexes thereof, or combinations thereof.

13. The method of claim 10, wherein (e) comprises only one of exposing the substrate to a plasma generated from a second process gas comprising hydrogen, nitrogen, argon, helium, or mixtures thereof, and thermally baking the substrate in hydrogen containing gas in an atmosphere under a pressure of less than one ATM.

14. A method of forming a cobalt layer on a substrate disposed in a process chamber, comprising:

(a) exposing the substrate to a ruthenium precursor to form a ruthenium layer on a first surface of the substrate and on sidewalls and a bottom surface of a feature formed in the first surface of the substrate, wherein the feature has an aspect ratio of about 6:1 to about 20:1;

(b) purging the process chamber of the ruthenium precursor;

(c) exposing the substrate to a first process gas comprising a cobalt precursor and a hydrogen containing gas to grow a smooth cobalt layer on the ruthenium layer formed on the first surface of the substrate and on the sidewalls and the bottom surface of the feature formed in the first surface of the substrate;

(d) purging the first process gas from the process chamber; and (e) annealing the substrate in a hydrogen atmosphere to fill in voids within the cobalt layer to form a void-free cobalt layer.

15. The method of claim 14, wherein the ruthenium precursor is one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$.

16. The method of claim 14, wherein the substrate is exposed to the hydrogen containing gas at a flow rate of about 100 sccm to about 2,000 sccm.

17. The method of claim 14, wherein the cobalt precursor is one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt (($CO)_3Co$ ($CH_2CH=CH_2$)), or derivatives thereof, complexes thereof, or combinations thereof.

18. The method of claim 14, further comprising exposing the substrate to a plasma generated from a second process gas comprising hydrogen, nitrogen, argon, helium, or mixtures thereof to remove contaminants from the cobalt layer.

19. The method of claim 14, further comprising repeating (c)-(d) to fill the feature with a cobalt layer.

20. The method of claim 14, wherein the hydrogen containing gas comprises ammonia, a hydrogen ($H_2$) gas, or a combination thereof.

* * * * *